United States Patent
Kim

(10) Patent No.: US 11,651,811 B2
(45) Date of Patent: May 16, 2023

(54) APPARATUS AND METHOD FOR PERFORMING TARGET REFRESH OPERATION

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 16 days.

(21) Appl. No.: 17/549,633

(22) Filed: Dec. 13, 2021

(65) Prior Publication Data
US 2022/0189536 A1    Jun. 16, 2022

Related U.S. Application Data

(60) Provisional application No. 63/125,089, filed on Dec. 14, 2020.

(30) Foreign Application Priority Data

Oct. 28, 2021    (KR) .......................... 10-2021-0145896

(51) Int. Cl.
*G11C 11/406* (2006.01)
*G11C 11/408* (2006.01)

(52) U.S. Cl.
CPC ...... *G11C 11/40615* (2013.01); *G11C 11/408* (2013.01)

(58) Field of Classification Search
CPC .......................... G11C 11/40615; G11C 11/408
USPC ......................................................... 365/222
See application file for complete search history.

(56) References Cited

U.S. PATENT DOCUMENTS

| | | |
|---|---|---|
| 2018/0005690 A1 | 1/2018 | Morgan et al. |
| 2020/0211632 A1 | 7/2020 | Noguchi |

*Primary Examiner* — Connie C Yoha
(74) *Attorney, Agent, or Firm* — IP & T Group LLP

(57) ABSTRACT

A memory apparatus comprises: a sampling circuit for sampling an input address through a sampling method corresponding to a first selection signal among at least two sampling methods, a storage circuit for storing up to N number of addresses having different values among sampled addresses received from the sampling circuit, an arranging circuit for determining an output sequence of addresses stored in the storage circuit through an arranging method corresponding to a second selection signal among the two arranging methods, and setting, as a target address, an address outputted according to the output sequence, a selection control circuit for setting each of the first selection signal and the second selection signal based on a state of the storage circuit, and a refresh operation circuit for controlling a target refresh operation on a row of memory cells corresponding to the target address.

19 Claims, 6 Drawing Sheets

APPARATUS AND METHOD FOR PERFORMING TARGET REFRESH OPERATION

CROSS-REFERENCE TO RELATED APPLICATION

This application claims priority under 35 U.S.C. § 119 to U.S. Provisional Patent Application No. 63/125,089, filed on Dec. 14, 2020 and Korean Patent Application No. 10-2021-0145896 filed on Oct. 28, 2021, which are incorporated herein by reference in their entirety.

BACKGROUND

1. Field

Various embodiments of the present disclosure relate to a semiconductor design technology, and specifically, to a semiconductor memory apparatus for performing a target refresh and an operating method thereof.

2. Discussion of the Related Art

Semiconductor memory devices for storing data may be roughly classified into volatile memory devices and non-volatile memory devices. The volatile memory devices such as dynamic random access memories (DRAMs) that store data by charging or discharging cell capacitors retain data stored therein while power is applied thereto, but lose the data stored therein when power is off. The non-volatile memory devices may store data therein although power is off. The volatile memory devices are mainly used as main memories of computers and the like, and the non-volatile memory devices are used as large-capacity memories that store programs and data in a wide range of application devices such as computers and portable communication devices.

A memory cell of the volatile memory device such as a DRAM is composed of a transistor serving as a switch and a capacitor for storing charge (data). "High" (logic 1) and "low" (logic 0) data are determined according to whether there is any charge in the capacitor in the memory cell, that is, according to whether a terminal voltage of the capacitor is high or low.

Since data is stored in a form in which charge is accumulated in the capacitor, there is no power consumption in principle. However, since there is a leakage current due to a PN junction and the like of the transistor, the initial amount of charge stored in the capacitor disappears, so that data may be lost. In order to substantially prevent such an issue, it is necessary to read data in a memory cell before the data is lost and to recharge the normal amount of charge according to the read information. Data storage is substantially maintained only when such an operation is periodically repeated, and such a recharge process of cell charge is referred to as a refresh operation, hereinafter, referred to as a normal refresh operation.

Recently, in addition to the normal refresh operation, an additional refresh operation, hereinafter, referred to as a target refresh operation, is performed on a memory cell of a specific word line, which is highly likely to lose data due to a row hammering phenomenon. The row hammering phenomenon refers to a phenomenon in which data of a memory cell electrically connected to a specific word line or adjacent word lines is damaged because the specific word line is frequently activated. In order to substantially prevent such a row hammering phenomenon, the target refresh operation is performed on word lines or adjacent word lines that are activated a predetermined number of times or more.

SUMMARY

Various embodiments of the present disclosure are directed to providing an apparatus and method for selecting an address for a target refresh operation.

In accordance with an embodiment of the present disclosure, a memory apparatus may include: a sampling circuit suitable for sampling an input address through a sampling method corresponding to a value of a first selection signal among at least two sampling methods designed using different algorithms; a storage circuit suitable for storing up to N number of addresses having different values among sampled addresses received from the sampling circuit; an arranging circuit suitable for: determining an output sequence of addresses stored in the storage circuit through an arranging method corresponding to a value of a second selection signal among at least two arranging methods designed using different algorithms, and setting, as a target address, an address outputted by the storage circuit according to the output sequence; a selection control circuit suitable for: checking a state of the storage circuit, and setting the value of each of the first selection signal and the second selection signal based on a result of the check; and a refresh operation circuit suitable for controlling a target refresh operation on a row of memory cells corresponding to the target address. N may be a natural number equal to or greater than 2.

In accordance with an embodiment of the present disclosure, an operating method of a memory apparatus, may include: a sampling operation of sampling an input address through a sampling method corresponding to a value of a first selection signal among at least two sampling methods designed using different algorithms; a storage operation of storing up to N number of addresses having different values in N number of address latches, respectively, among addresses sampled in the sampling operation; an arranging operation of: determining an output sequence of the stored addresses through an arranging method corresponding to a value of a second selection signal among at least two arranging methods designed using different algorithms, and setting, as a target address, an address stored in a latch corresponding to the output sequence among the N number of address latches; a determination operation of determining the value of each of the first selection signal and the second selection signal based on a number of latches in which addresses are stored among the N number of address latches; and an operation of performing a target refresh operation on a row of memory cells corresponding to the target address. N may be a natural number equal to or greater than 2.

In accordance with an embodiment of the present disclosure, an operating method of a memory device including rows of memory cells, the operating method may include: sampling input addresses according to a selected one of sampling schemes; latching the sampled addresses such that the latched addresses are different from one another; arranging the latched addresses according to an arranging scheme; selecting target addresses sequentially from the arranged addresses; and performing target refresh operations on the rows corresponding to the target addresses, respectively. The sampling may include selecting the sampling scheme based on a number of the latched addresses.

In accordance with an embodiment of the present disclosure, an operating method of a memory device including rows of memory cells, the operating method may include: sampling input addresses according to a sampling scheme; latching the sampled input addresses such that the latched addresses are different from one another; arranging the latched addresses according to a selected one of arranging schemes; selecting target addresses sequentially from the arranged addresses; and performing target refresh operations on the rows corresponding to the target addresses, respectively. The arranging may include selecting the arranging scheme based on a number of the latched addresses.

This technology can select any of several types of sampling methods designed using different algorithms and sample an address. Furthermore, this technology can select any of several types of alignment methods designed using different algorithms and adjust the sequence according to which sampled address is applied to a target refresh operation.

Accordingly, a result is that an address having the highest probability that data will be lost due to a row-hammering phenomenon is more efficiently selected.

DETAILED DESCRIPTION

Figure 1:
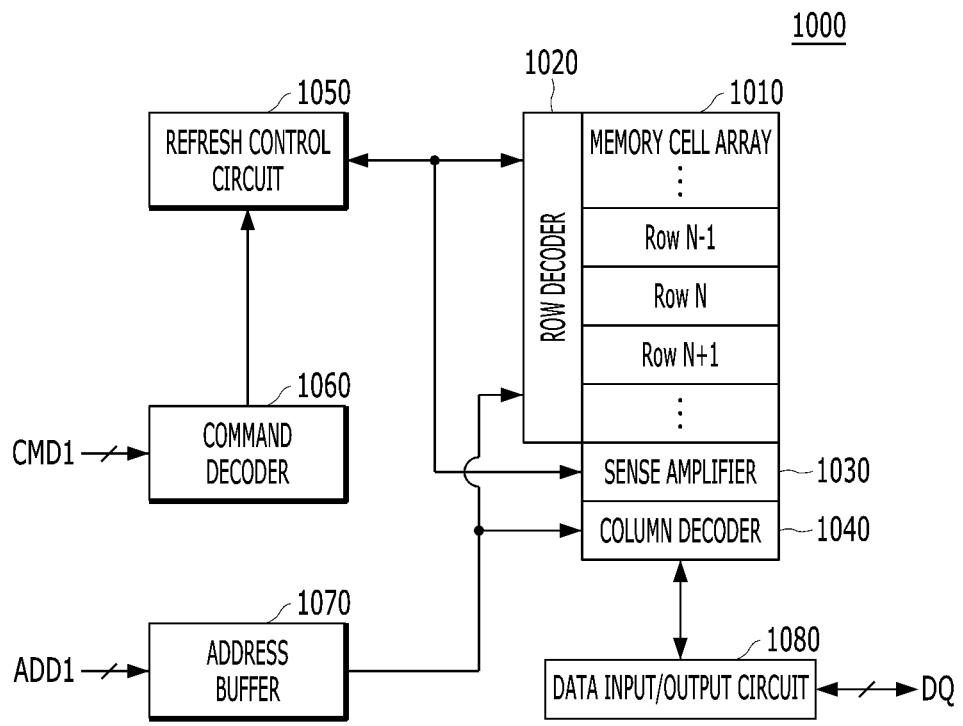
FIG. 1 is a block diagram illustrating a semiconductor memory apparatus including a memory cell array according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination.

That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a block diagram illustrating a semiconductor memory device including a memory cell array according to an embodiment of the present disclosure. Hereinafter, a case where a memory device 1000 is a DRAM memory device will be described as an example.

Referring to FIG. 1, the semiconductor memory device 1000 includes a memory cell array 1010, a row decoder 1020, a sense amplifier 1030, a column decoder 1040, a refresh control circuit 1050, a command decoder 1060, an address buffer 1070, and a data input/output circuit 1080.

The memory cell array 1010 may include a plurality of memory cells arranged in a row direction and a column direction. In the present specification, memory cells arranged in one row direction are defined as rows.

FIG. 1 illustrates an arrangement of memory cells in the row direction. The plurality of memory cells may include not only normal cells used for data storage, but also redundancy cells (not illustrated) for replacing a memory cell in which an error has occurred. The redundancy cells have substantially the same structure as the normal cells, and a redundancy cell array including such redundancy cells may be used as an extra memory area of the memory device 1000.

The command decoder 1060 may receive a command CMD1 applied from a controller (not illustrated), decode the received command, and internally generate decoded control signals, for example, an active signal, a read signal, a write signal, and a refresh signal. The refresh control circuit 1050 may receive the refresh signal from the command decoder 1060, and output a row address to the row decoder 1020 in order to refresh one word line of the memory cell array 1010.

The controller may transmit an address ADD1 for designating a memory cell for writing/reading data to the memory device 1000 together with the command CMD1. The address buffer 1070 may receive the address ADD1 from a control logic, and generate row/column addresses.

The row decoder 1020 may decode the row address, which is outputted from the refresh control circuit 1050 or the address buffer 1070, in order to designate one word line of the memory cell array 1010. That is, the row decoder 1020 may decode the row address outputted from the address buffer 1070 during a written/read operation, thereby enabling a word line electrically connected to a memory cell in/from which data is to be written or read. Furthermore, the row decoder 1020 may refresh a corresponding row on the basis of the row address generated from the refresh control circuit 1050.

The sense amplifier 1030 may sense and amplify data of a memory cell electrically connected to the word line designated by the row decoder 1020, and store data of the memory cell. Furthermore, the column decoder 1040 may decode the column address, which is outputted from the address buffer 1070, in order to designate a bit line electrically connected to a memory cell to/from which data is to be inputted or outputted.

The data input/output circuit 1080 outputs data from a memory cell designated by the address ADD1 in the memory cell array 1010, or inputs data to the memory cell. As a consequence, the data inputted through the data input/output circuit 1080 may be written in the memory cell array 1010 on the basis of the address ADD1, or the data read from the memory cell array 1010 may be outputted to the controller through the data input/output circuit 1080 on the basis of the address ADD1.

Moreover, when the row decoder 1020 applies a voltage to a word line corresponding to an $N^{th}$ row Row N in order to access the $N^{th}$ row Row N, an electromagnetic field is formed around the word line. When the $N^{th}$ row is frequently accessed, row hammering may occur, in which data stored in rows adjacent to the $N^{th}$ row, for example, an $N-1^{th}$ row Row N-1 and an $N+1^{th}$ row Row N+1, are distorted because the rows are continuously affected by the electromagnetic field.

There is known a technique of performing the target refresh operation on neighboring rows when a certain row is frequently accessed, in order to substantially prevent data stored in the memory cell array 1010 from being lost due to the row hammering.

Figure 2:
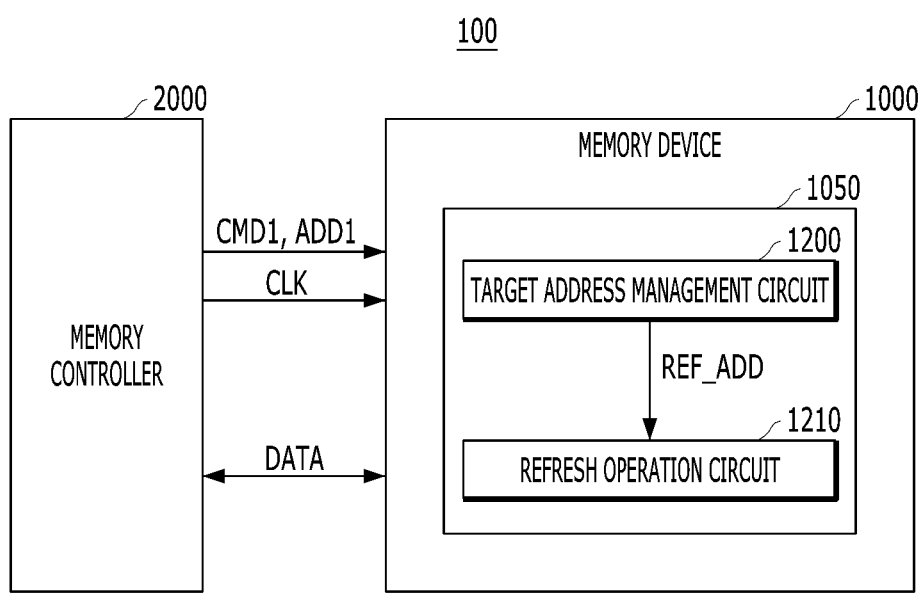
FIG. 2 is a diagram schematically illustrating a structure of a memory system including a semiconductor memory apparatus according to an embodiment of the present disclosure.

FIG. 2 is a diagram schematically illustrating a structure of a memory system including the semiconductor memory device in accordance with an embodiment of the present disclosure.

Referring to FIG. 2, a memory system 100 may include a memory controller 2000 and the memory device 1000. Each of the memory controller 2000 and the memory device 1000 may include an interface for mutual communication. A command CMD1 may be regarded as including an access address ADD1 depending on the type of a memory device. The memory controller 2000 may generate the command CMD1 and the access address ADD1 for controlling the memory device 1000, and data DATA may be written in the memory device 1000 or the data DATA may be read from the memory device 1000 under the control of the memory controller 2000.

As described above with reference to FIG. 1, the memory device 1000 may include the refresh control circuit 1050. Furthermore, in accordance with an embodiment of the present disclosure, the refresh control circuit 1050 included in the memory device 1000 may include a target address management circuit 1200 and a refresh operation circuit 1210.

The target address management circuit 1200 may manage a target address, which is intensively accessed among access addresses, for a target refresh operation of the memory device 1000.

The refresh operation circuit 1210 may apply an address REF_ADD, which is outputted to the target address management circuit 1200, to the target refresh operation. The refresh operation circuit 1210 may refer to a circuit for performing the target refresh operation among operations of the refresh control circuit 1050 for controlling all refresh operations of the semiconductor memory device 1000. For example, the refresh operation circuit 1210 may refer to a circuit for performing a refresh operation on memory cells coupled to a preset number of word lines adjacent to a word line corresponding to the address REF_ADD outputted to the target address management circuit 1200.

For reference, FIG. 2 illustrates that one memory device 1000 is included in the memory system 100; however, a plurality of memory devices may also be included in the memory system 100 according to a designer. Furthermore, the plurality of memory devices may each be divided into at least one memory module. In an embodiment, the memory module may include a dual in-line memory module (DIMM), an unbuffered dual in-line memory module (UDIMM), a registered dual in-line memory module (RDIMM), a load reduced dual in-line memory module (LRDIMM), a fully buffered dual in-line memory module (FBDIMM), and the like.

Figure 3:
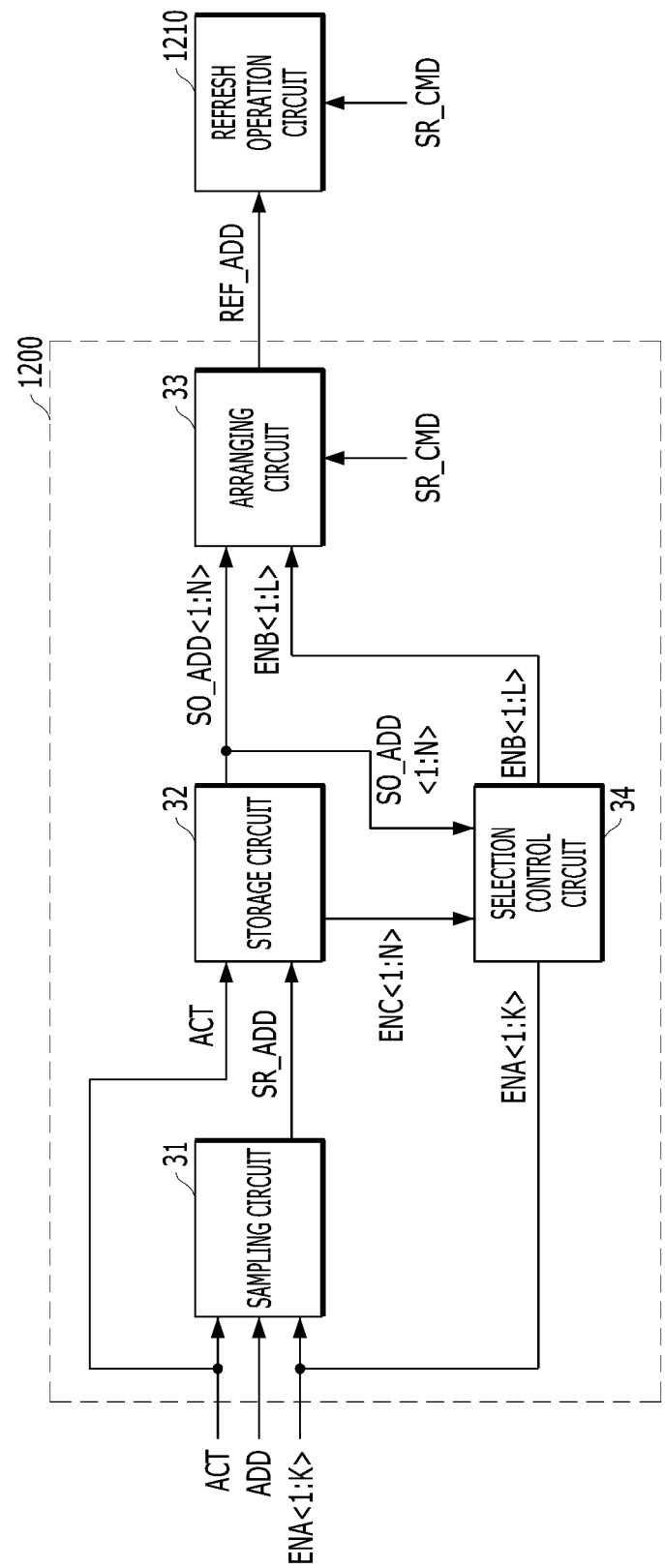
FIG. 3 is a diagram schematically illustrating a structure of a target address management circuit according to an embodiment of the present disclosure.

FIG. 3 is a diagram schematically illustrating a structure of a target address management circuit and a refresh operation circuit included in the refresh control circuit according to an embodiment of the present disclosure.

Referring to FIG. 3, the refresh control circuit 1050 may include the target address management circuit 1200 and the refresh operation circuit 1210.

In this case, the target address management circuit 1200 may include a sampling circuit 31, a storage circuit 32, an arranging circuit 33, and a selection control circuit 34.

The sampling circuit 31 may sample an input address ADD through one sampling method among K number of sampling methods designed using different algorithms and corresponding to values of first selection signals ENA<1:K>. In this case, K may be a natural number equal to or greater than 2.

That is, the sampling circuit 31 may sample the input address ADD through one of at least two sampling methods designed using different algorithms, and may output the sample input address as a sampled address SR_ADD.

In this case, the input address ADD may mean an address inputted along with an active command ACT.

The storage circuit 32 may store up to N number of addresses having different values among the sampled addresses SR_ADD received from the sampling circuit 31. In this case, N may be a natural number equal to or greater than 2.

Furthermore, the storage circuit 32 may generate corresponding storage check signals ENC<1:N> whenever the storage circuit 32 receives the sampled address SR_ADD and stores the sampled address SR_ADD therein.

In an embodiment, the storage circuit 32 may generate a first storage check signal ENC<1> in response to the address SR_ADD sampled for the first time and stored therein. Likewise, the storage circuit 32 may generate a second storage check signal ENC<2> in response to the address SR_ADD sampled for the second time and stored therein. Through such a method, the storage circuit 32 may generate the first to N-th storage check signals ENC<1:N>.

The arranging circuit 33 may determine an output sequence for the N number of addresses SO_ADD<1:N>, stored in the storage circuit 32, through an arranging method among L number of arranging methods designed using different algorithms and corresponding to values of second selection signals ENB<1:L>, and may set, as a target address REF_ADD, the addresses SO_ADD<1:N> outputted by the storage circuit 32 according to the determined output sequence. In this case, L may be a natural number equal to or greater than 2.

That is, the arranging circuit 33 may determine the sequence according to which the N number of addresses SO_ADD<1:N> stored in the storage circuit 32 are outputted, through one of at least two arranging methods designed using different algorithms, may receive the N number of addresses SO_ADD<1:N> stored in the storage circuit 32 at least one by one according to the determined output sequence, and may set the received address as the target address REF_ADD.

In an embodiment, after determining the output sequence of the N number of addresses SO_ADD<1:N> stored in the storage circuit 32, the arranging circuit 33 may receive the N number of addresses SO_ADD<1:N> stored in the storage circuit 32 one by one according to the determined output sequence whenever the arranging circuit 33 receives a target refresh command SR_CMD, and may set the received address as the target address REF_ADD.

Several sampling methods and arranging methods disclosed in Korean Patent Application Publication Nos. 10-2021-0015548, 10-2021-0006102 and 10-2021-0021915, which are incorporated herein by reference in their entirety, may be used as the K number of sampling methods which may be selected by the sampling circuit 31 and the L number of arranging methods which may be selected by the arranging circuit 33.

In this case, a specific one of the K number of sampling methods and a specific one of the L number of arranging methods do not need to be associated with each other in a form which corresponds to each other. Furthermore, each of K and L is a natural number equal to or greater than 2. The two variables do not need to have associated values. For example, the two variables do not need to always have the same value or the two variables do not need to always have different values.

In an embodiment, after the input address ADD is sampled using the sampling method and arranging method disclosed in Korean Patent Application Publication No. 10-2021-0021915, which is incorporated herein by reference in its entirety, the at least two sampled addresses may be set as the target addresses.

In another embodiment, after the input address ADD is sampled using the sampling method disclosed in Korean Patent Application Publication No. 10-2021-0015548, which is incorporated herein by reference in its entirety, the arranging method disclosed in Korean Patent Application Publication No. 10-2021-0006102, which is incorporated herein by reference in its entirety, may be used in order to determine the sequence according to which the at least two sampled addresses are set as the target addresses.

The selection control circuit 34 may check a state of the storage circuit 32 and may determine values of the first selection signals ENA<1:K> and values of the second selection signals ENB<1:L> based on a result of the check.

In this case, in order to check the state of the storage circuit 32, the selection control circuit 34 may receive the storage check signals ENC<1:N> and the stored addresses SO_ADD<1:N> from the storage circuit 32.

In an embodiment, the selection control circuit 34 may check the state of the storage circuit 32 through an operation of checking the number of storage check signals ENC<1:N> received from the storage circuit 32 and the number of addresses that belong to the addresses SO_ADD<1:N> stored in the storage circuit 32 and that are outputted as the target address REF_ADD by the arranging circuit 33, and count the number of addresses SO_ADD<1:N> stored in the storage circuit 32, based on a result of the check.

For example, the selection control circuit 34 may check that three addresses have been stored in the storage circuit 32, in response to the first storage check signal ENC<1>, the second storage check signal ENC<2> and the third storage check signal ENC<3> received from the storage circuit 32. In such a state, if a first stored address SO_ADD<1> is outputted as the target address REF_ADD by the arranging circuit 33, the selection control circuit 34 may check that the number of addresses stored in the storage circuit 32 has changed from 3 to 2.

Accordingly, the selection control circuit 34 may compare, with a reference number, the number of addresses SO_ADD<1:N> stored in the storage circuit 32, and may selectively change values of the first selection signals ENA<1:K> and values of the second selection signals ENB<1:L> based on a result of the comparison.

In an embodiment, when the number of addresses SO_ADD<1:N> stored in the storage circuit 32 is the reference number or less, the selection control circuit 34 may change a value of at least one signal among the values of the first selection signals ENA<1:K> and the values of the second selection signals ENB<1:L>.

For example, when the reference number is 2, the selection control circuit 34 may change a value of at least one signal among the values of the first selection signals ENA<1:K> and the values of the second selection signals ENB<1:L>, in response to the number of addresses SO_ADD<1:N> stored in the storage circuit 32, which is checked as two or less.

In another embodiment, when the number of addresses SO_ADD<1:N> stored in the storage circuit 32 is greater than the reference number, the selection control circuit 34 may maintain the values of the first selection signals ENA<1:K> and the values of the second selection signals ENB<1:L> without changing the values of the first selection signals ENA<1:K> and the values of the second selection signals ENB<1:L>.

For example, when the reference number is 2, the selection control circuit 34 may maintain the values of the first selection signals ENA<1:K> and values of the second selection signals ENB<1:L> without changing the values of the first selection signals ENA<1:K> and the values of the second selection signals ENB<1:L>, in response to the number of addresses SO_ADD<1:N> stored in the storage circuit 32, which is checked as three or more.

In this case, when the selection control circuit 34 changes the values of the first selection signals ENA<1:K>, it may mean that the selection control circuit 34 changes a sampling method used by the sampling circuit 31.

In an embodiment, when the sampling circuit 31 is operating according to a first sampling method in response to the first selection signals ENA<1:K> being set as a first value by the selection control circuit 34, when the selection control circuit 34 changes values of the first selection signals ENA<1:K> into a second value, the sampling circuit 31 may operate according to a second sampling method designed using an algorithm different from an algorithm of the first sampling method.

Furthermore, when the selection control circuit 34 changes the values of the second selection signals ENB<1:L>, it may mean that the selection control circuit 34 changes an arranging method used by the arranging circuit 33.

In an embodiment, when the arranging circuit 33 is operating according to a first arranging method in response to the second selection signals ENB<1:L> being set as a third value by the selection control circuit 34, when the selection control circuit 34 changes values of the second selection signals ENB<1:L> into a fourth value, the arranging circuit 33 may operate according to a second arranging method designed using an algorithm different from an algorithm of the first arranging method.

The selection control circuit 34 may check the number of addresses SO_ADD<1:N> stored in the storage circuit 32 every set period. In this case, the set period may be set based on a specific operation being performed by the memory apparatus 1000.

In an embodiment, the set period may be set based on the number of times that a refresh operation is performed by the memory apparatus 1000.

For example, the set period may be a period repeated whenever a refresh operation is performed once on all word lines included in the memory apparatus 1000.

In another embodiment, the set period may be set based on the number of active commands inputted to the memory apparatus 1000.

For example, the set period may be a period repeated whenever the number of active commands inputted to the memory apparatus 1000 reaches a predetermined specific number.

The refresh operation circuit 1210 may apply, to a target refresh operation, the target address REF_ADD outputted by the storage circuit 32 in an output sequence determined by the arranging circuit 33 included in the target address management circuit 1200. In this case, as described with reference to FIG. 2, the refresh operation circuit 1210 may mean a circuit for performing a target refresh operation in an operation of the refresh control circuit 1050 for controlling all refresh operations of the semiconductor memory apparatus 1000. For example, the refresh operation circuit 1210 may mean a circuit for performing a refresh operation on memory cells coupled to at least one word line adjacent to a word line corresponding to the target address REF_ADD outputted by the target address management circuit 1200.

Figure 4:
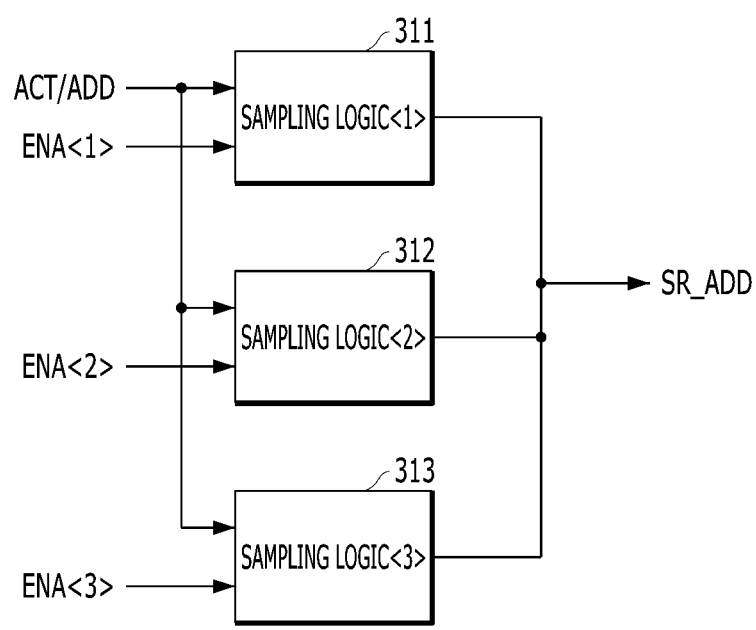
FIG. 4 is a diagram schematically illustrating a structure of a sampling circuit among elements of the target address management circuit illustrated in FIG. 3 according to an embodiment of the present disclosure.

FIG. 4 is a diagram schematically illustrating a structure of the sampling circuit among elements of the target address management circuit illustrated in FIG. 3 according to an embodiment of the present disclosure.

First, as described with reference to FIG. 3, the sampling circuit 31 may sample the input address ADD through one sampling method among the K number of sampling methods designed using different algorithms and corresponding to values of the first selection signals ENA<1:K>. In this case, K may be a natural number equal to or greater than 2. In FIG. 4, the descriptions will be made based on K is 3.

Referring to FIG. 4, the sampling circuit 31 may sample the input address ADD corresponding to the active command ACT through one sampling method among three sampling methods designed using different algorithms and corresponding to values of three first selection signals ENA<1:3>.

Specifically, the sampling circuit 31 may include three sampling logic circuits 311, 312, and 313 which sample the input address ADD corresponding to the active command ACT through one sampling method among the three different sampling methods designed using different algorithms, and output the sampled input address as a sampled address SR_ADD.

Whether each of the three sampling logic circuits 311, 312, and 313 will be enabled may be determined based on values of the three first selection signals ENA<1:3>, respectively. In an embodiment, whether the first sampling logic circuit 311 will be enabled may be determined based on a value of the first value of the first selection signal ENA<1>. Whether the second sampling logic circuit 312 will be enabled may be determined based on the second value of the first selection signal ENA<2>. Whether the third sampling logic circuit 313 will be enabled may be determined based on the third value of the first selection signal ENA<3>.

In this case, only one signal ENA<1> or ENA<2> or ENA<3> of the three first selection signals ENA<1:3> may be enabled. That is, only one of the three sampling logic circuits 311, 312, and 313 may be enabled.

Each of the three sampling logic circuits 311, 312, and 313 in the enable state may output the sampled address SR_ADD by performing a sampling operation on the input address ADD received in response to the active command ACT.

In this case, although the same input address ADD is applied to the three sampling logic circuits 311, 312, and 313, the sampled addresses SR_ADD outputted by the three sampling logic circuits 311, 312, and 313 may be different because the three sampling logic circuits 311, 312, and 313 use sampling methods designed using different algorithms.

In an embodiment, the first sampling logic circuit 311 may output the sampled address SR_ADD by performing a sampling operation on the input address ADD by using a first sampling method. Furthermore, the second sampling logic circuit 312 may output the sampled address SR_ADD by performing a sampling operation on the input address ADD by using a second sampling method designed using an algorithm different from the algorithm of the first sampling method. In this case, although the input addresses ADD applied to the first sampling logic circuit 311 and the second sampling logic circuit 312 are fully the same, the sampled address SR_ADD generated by the first sampling logic circuit 311 and the sampled address SR_ADD generated by the second sampling logic circuit 312 may be different because the first sampling logic circuit 311 uses the first sampling method and the second sampling logic circuit 312 uses the second sampling method.

For example, the first sampling method may be a method of sampling an address inputted during a random time from input timing of the active command ACT. Furthermore, the second sampling method may be a method of sampling an address inputted during a predetermined time after a lapse of a given time from input timing of the active command ACT unlike the first sampling method.

Likewise, the third sampling logic circuit 313 may output the sampled address SR_ADD by performing a sampling operation on the input address ADD by using a third sampling method designed using an algorithm different from the algorithms of the first and second sampling methods. In this case, although the input addresses ADD applied to the first sampling logic circuit 311, the second sampling logic circuit 312 and the third sampling logic circuit 313 are fully the same, the sampled address SR_ADD generated by the first sampling logic circuit 311, the sampled address SR_ADD generated by the second sampling logic circuit 312, and the sampled address SR_ADD generated by the third sampling logic circuit 313 may be different because the first sampling logic circuit 311 uses the first sampling method, the second sampling logic circuit 312 uses the second sampling method, and the third sampling logic circuit 313 uses the third sampling method.

The first sampling method used by the first sampling logic circuit 311 included in the sampling circuit 31 may be the sampling method disclosed in Korean Patent Application Publication No. 10-2021-0015548, which is incorporated herein by reference in its entirety.

Furthermore, the second sampling method used by the second sampling logic circuit 312 included in the sampling circuit 31 may be the sampling method disclosed in Korean Patent Application Publication No. 10-2021-0006102, which is incorporated herein by reference in its entirety.

Furthermore, the third sampling method used by the third sampling logic circuit 313 included in the sampling circuit 31 may be the sampling method in disclosed in Korean Patent Application Publication No. 10-2021-0021915, which is incorporated herein by reference in its entirety.

Figure 5:
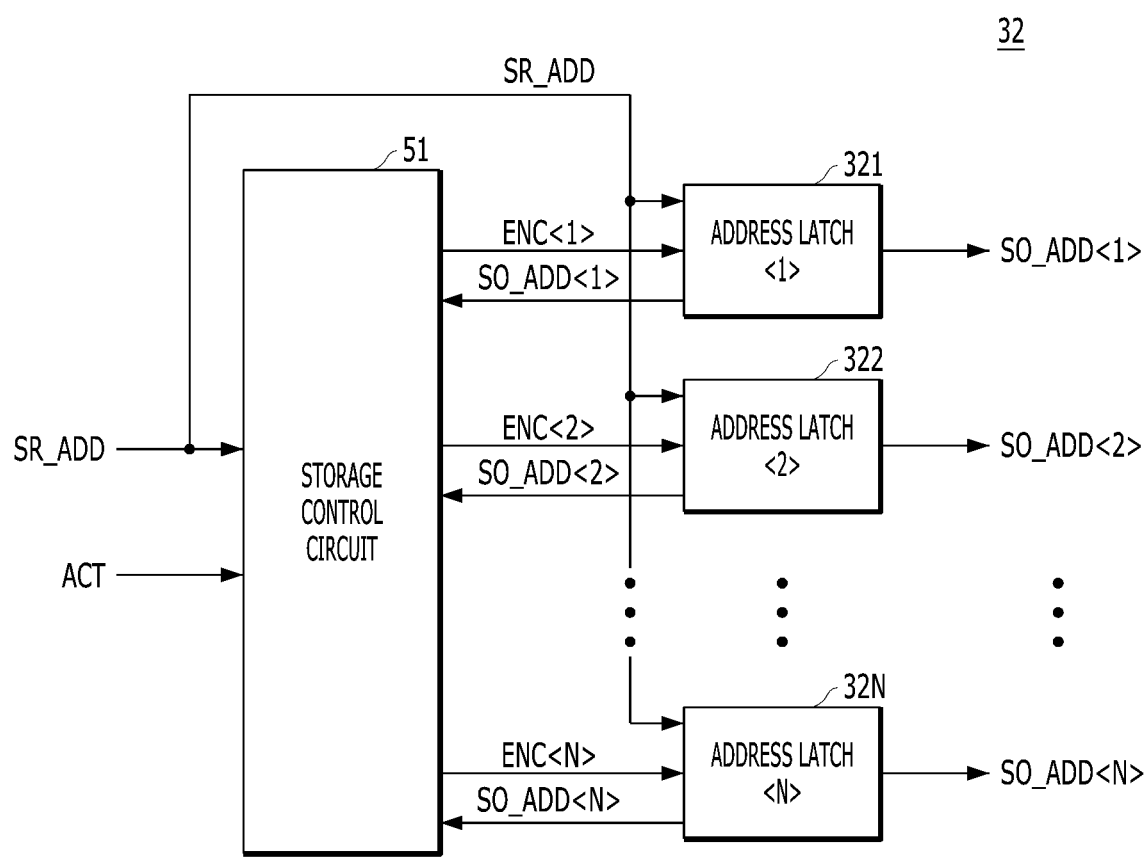
FIG. 5 is a diagram schematically illustrating a structure of a storage circuit among the elements of the target address management circuit illustrated in FIG. 3 according to an embodiment of the present disclosure.

FIG. 5 is a diagram schematically illustrating a structure of the storage circuit among the elements of the target address management circuit illustrated in FIG. 3 according to an embodiment of the present disclosure.

First, as described with reference to FIG. 3, the storage circuit 32 may store up to N number of addresses having different values among the sampled addresses SR_ADD received from the sampling circuit 31. Furthermore, the storage circuit 32 may generate corresponding storage check signals ENC<1:N> whenever the storage circuit 3 receives and stores the sampled address SR_ADD therein. In this case, N may be a natural number equal to or greater than 2. In FIG. 5, the descriptions will be made on the basis of when N number is not specified.

Referring to FIG. 5, the storage circuit 32 may include N number of address latches 321, 322, . . . , 32N, and a storage control circuit 51.

Each of the N number of address latches 321, 322, . . . , 32N may store the sampled address SR_ADD received from the sampling circuit 31. That is, the N number of address latches 321, 322, . . . , 32N may store the sampled address SR_ADD, received from the sampling circuit 31, as N number of addresses SO_ADD<1:N>.

The storage control circuit 51 may control, in response to the active command ACT, that a value of the sampled address SR_ADD received from the sampling circuit 31 and each of values of the addresses SO_ADD<1:N> respectively stored in the N number of address latches 321, 322, . . . , 32N are compared and the sampled address SR_ADD received from the sampling circuit 31 is stored in each of the N number of address latches 321, 322, . . . , 32N in response to a result of the comparison.

Specifically, each of the N number of address latches 321, 322, . . . , 32N may store the sampled address SR_ADD in response to each of the N storage check signals ENC<1:N> applied by the storage control circuit 51.

In an embodiment, when one sampled address SR_ADD is applied in response to the active command ACT, a maximum of one signal of the N storage check signals ENC<1:N> may be toggled in the state in which the applied sampled address SR_ADD has been applied to the N number of address latches 321, 322, . . . , 32N in parallel. The sampled address SR_ADD may be stored only in a maximum of one address latch corresponding to the toggled storage check signal.

For example, the sampled address SR_ADD may be stored only in the first address latch 321 in response to the first storage check signal ENC<1> being toggled and the remaining storage check signals ENC<2:N> being not toggled. According to another example, the sampled address SR_ADD may be stored only in the fourth address latch 324 in response to the fourth storage check signal ENC<4> being toggled and the remaining storage check signals ENC<1:3, 5:N> being not toggled. According to still another example, the sampled address SR_ADD may not be stored in the N number of address latches 321, 322, . . . , 32N in response to none of N storage check signals ENC<1:N> being toggled.

The storage control circuit 51 may compare a value of the sampled address SR_ADD, received from the sampling circuit 31, with each of values of the addresses SO_ADD<1: N> respectively stored in the N number of address latches 321, 322, . . . , 32N in a set sequence in response to the active command ACT, and may determine whether to toggle each of the N storage check signals ENC<1:N> based on a result of the comparison.

In this case, the set sequence may mean a sequence for once selecting each of latches in which addresses are stored among the N number of address latches 321, 322, . . . , 32N. For example, addresses are stored only in the first, second and fourth address latches 321, 322, and 324 among the N number of address latches 321, 322, . . . , 32N and the remaining address latches 323, 325, . . . , 32N are empty. In such a state, the set sequence may mean that only an address latch in which an address has been stored is selected once in a way to select the first address latch 321, select the second address latch 322, and then select the fourth address latch 324.

Furthermore, the storage control circuit 51 may toggle only a maximum of one signal of the N storage check signals ENC<1:N> in response to one sampled address SR_ADD being inputted.

Furthermore, separately from the operation of comparing the sampled address SR_ADD with each of values of the addresses SO_ADD<1:N> respectively stored in the N number of address latches 321, 322, . . . , 32N in the set sequence and determining whether to toggle each of the N storage check signals ENC<1:N>, the storage control circuit 51 may stop the execution of the remaining subsequent comparison operations based on a result of a previous comparison operation in a set sequence.

In an embodiment, when receiving the sampled address SR_ADD from the sampling circuit 31 in response to the active command ACT, the storage control circuit 51 may compare a value of the sampled address SR_ADD and a value of an address stored in the first address latch 321, and may determine whether to toggle the first storage check signal ENC<1> based on a result of the comparison.

When the value of the sampled address SR_ADD and the value of the stored address are the same as each other as a result of the comparison, the storage control circuit 51 may toggle the first storage check signal ENC<1>, and may stop a subsequent comparison operation, that is, an operation of selecting the second to N-th address latches 322 to 32N in the set sequence and comparing a value of an address stored in the selected address latch with the value of the sampled address SR_ADD.

When the value of the sampled address SR_ADD and the value of the stored address are not the same as each other as a result of the comparison, the storage control circuit 51 may not toggle the first storage check signal ENC<1>, and may continuously perform a subsequent comparison operation, that is, an operation of selecting the second to N-th address latches 322 to 32N in the set sequence and comparing a value of an address stored in the selected address latch and the value of the sampled address SR_ADD.

If at least one empty address latch is included in the N number of address latches 321, 322, . . . , 32N and the same value is not present as a result of a comparison between a value of the sampled address SR_ADD and each of values of all addresses respectively stored in the remaining address latches except the empty address latch among the N number of address latches 321, 322, . . . , 32N in a set sequence, the storage control circuit 51 may store the sampled address SR_ADD in the empty address latch, and may toggle a storage check signal ENC corresponding to an address latch in which the sampled address SR_ADD is stored.

For example, (N−2) addresses SO_ADD<1:N−2> are stored in the first to (N−2)-th address latches 321, 322, . . . , 32N−2, respectively, and the N-th address latch 32N is an empty address latch. In such a state, when receiving one sampled address SR_ADD from the sampling circuit 31 in response to the active command ACT, the storage control circuit 51 may compare a value of the received sampled address SR_ADD and each of values of the (N−2) addresses SO_ADD<1:N−2> respectively stored in the first to (N−2)-th address latches 321, 322, . . . , 32N−2. If, as a result of the comparison, all the values of the (N−2) addresses SO_ADD<1:N−2> stored in the first to (N−2)-th address latches 321, 322, . . . , 32N−2 are different from the value of the sampled address SR_ADD, the storage control circuit 51 may toggle any one signal of the (N−1)-th storage check signal ENC<N−1> and the N-th storage check signal ENC<N> in order to store the sampled address SR_ADD in one of the (N−1)-th and N-th address latches 32N−1 and 32N, that is, empty address latches.

If the same value is not present as a result of a comparison between each of all values of the addresses SO_ADD<1:N> respectively stored in the N number of address latches 321, 322, . . . , 32N and a value of the sampled address SR_ADD in a set sequence because an empty address latch is not included in the N number of address latches 321, 322, . . . , 32N, the storage control circuit 51 may not store the sampled address SR_ADD, and may not toggle the storage check signals ENC<1:N>.

For example, N number of addresses SO_ADD<1:N> are stored in the first to N-th address latches 321, 322, . . . , 32N, respectively, and an empty address latch is not present. In such a state, when receiving one sampled address SR_ADD from the sampling circuit 31 in response to the active command ACT, the storage control circuit 51 may compare a value of the received sampled address SR_ADD and each of values of the N number of addresses SO_ADD<1:N> stored in the first to N-th address latches 321, 322, . . . , 32N. When all of the values of the N number of addresses SO_ADD<1:N> stored in the first to N-th address latches 321, 322, . . . , 32N−1 are different from the value of the sampled address SR_ADD as a result of the comparison, the storage control circuit 51 may give up the storage of the sampled address SR_ADD, and may toggle none of the N storage check signals ENC<1:N>.

Figure 6:
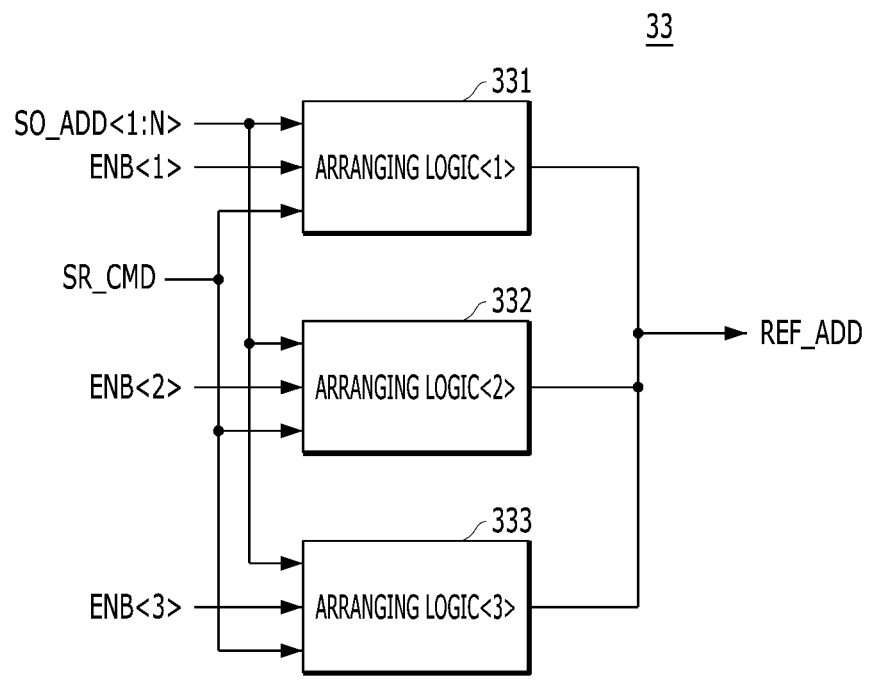
FIG. 6 is a diagram illustrating an arranging circuit among the elements of the target address management circuit illustrated in FIG. 3 according to an embodiment of the present disclosure.

FIG. 6 is a diagram illustrating the arranging circuit among the elements of the target address management circuit illustrated in FIG. 3 according to an embodiment of the present disclosure.

First, as described with reference to FIG. 3, the arranging circuit 33 may determine an output sequence for a N number of addresses SO_ADD<1:N> stored in the storage circuit 32 through one arranging method among the L number of arranging methods designed using different algorithms and corresponding to values of the second selection signals ENB<1:L>, and may set, as the target address REF_ADD, the addresses SO_ADD<1:N> outputted by the storage circuit 32 in a determined output sequence. In this case, L is a natural number equal to or greater than 2. In FIG. 6, the descriptions will be made on L is 3.

Referring to FIG. 6, the arranging circuit 33 may determine an output sequence for N number of addresses SO_ADD<1:N> stored in the storage circuit 32 through one arranging method among three arranging methods designed using different algorithms and corresponding to values of three second selection signals ENB<1:3>.

Specifically, the arranging circuit 33 may include the three arranging logic circuits 331, 332, and 333 which determine the output sequence of the N number of addresses SO_ADD<1:N> stored in the storage circuit 32 through one of arranging methods among the three different arranging methods and set, as the target address REF_ADD, an address stored in a latch corresponding to the output sequence among the N number of address latches 321, 322, . . . , 32N.

Whether each of the three arranging logic circuits 331, 332, and 333 will be enabled may be determined based on each of values of the three second selection signals ENB<1: 3>. In an embodiment, whether the first arranging logic circuit 331 will be enabled may be determined based on the first value of the second selection signal ENB<1>. Whether the second arranging logic circuit 332 will be enabled may be determined based on the second value of the second selection signal ENB<2>. Whether the third arranging logic circuit 333 will be enabled may be determined based on the third value of the second selection signal ENB<3>.

In this case, only one signal ENB<1> or ENB<2> or ENB<3> of the three second selection signals ENB<1:3> may be enabled. That is, only one of the three arranging logic circuits 331, 332, and 333 may be enabled.

Each of the three arranging logic circuits 331, 332, and 333 in the enable state may determine the output sequence by performing an arranging operation on a N number of addresses SO_ADD<1:N> stored in the storage circuit 32.

In this case, the three arranging logic circuits 331, 332, and 333 may use arranging methods designed using different algorithms, respectively. Therefore, although the three arranging logic circuits 331, 332, and 333 identically perform arranging operations on the N number of addresses SO_ADD<1:N> stored in the storage circuit 32, output sequences respectively determined by the three arranging logic circuits 331, 332, and 333, that is, in which sequences the N number of addresses SO_ADD<1:N> stored in the storage circuit 32 will be outputted may be different from one another.

In an embodiment, the first arranging logic circuit 331 may determine the output sequence by performing an arranging operation on the N number of addresses SO_ADD<1:N> stored in the storage circuit 32 by using a first arranging method. Furthermore, the second arranging logic circuit 332 may determine the output sequence by performing an arranging operation on the N number of addresses SO_ADD<1:N> stored in the storage circuit 32 by using a second arranging method designed using an algorithm different from the algorithm of the first arranging method. In this case, although the first arranging logic circuit 331 and the second arranging logic circuit 332 completely identically perform the arranging operations on the N number of addresses SO_ADD<1:N> stored in the storage circuit 32, the output sequence determined by the first arranging logic circuit 331 and the output sequence determined by the second arranging logic circuit 332 may be different from each other because the first arranging logic circuit 331 uses the first arranging method and the second arranging logic circuit 332 uses the second arranging method.

For example, the first arranging method may be a method of determining the output sequence based on the number of addresses redundantly applied among the N number of addresses SO_ADD<1:N> stored in the storage circuit 32. Furthermore, the second arranging method may be a method of determining the output sequence by randomly selecting the N number of addresses SO_ADD<1:N> stored in the storage circuit 32.

Likewise, the third arranging logic circuit 333 may determine the output sequence by performing an arranging operation on the N number of addresses SO_ADD<1:N> stored in the storage circuit 32 by using a third arranging method designed using an algorithm different from the algorithms of the first and second arranging methods. In this case, although the first arranging logic circuit 331, the second arranging logic circuit 332, and the third arranging logic circuit 333 completely identically perform the arranging operations on the N number of addresses SO_ADD<1:N> stored in the storage circuit 32, the output sequence determined by the first arranging logic circuit 331, the output sequence determined by the second arranging logic circuit 332, and the output sequence determined by the third arranging logic circuit 333 may be different from one another because the first arranging logic circuit 331 uses the first arranging method, the second arranging logic circuit 332 uses the second arranging method, and the third arranging logic circuit 333 uses the third arranging method.

The first arranging method used by the first arranging logic circuit 331 included in the arranging circuit 33 may be the arranging method disclosed in Korean Patent Application Publication No. 10-2021-0015548, which is incorporated herein by reference in its entirety.

Furthermore, the second arranging method used by the second arranging logic circuit 332 included in the arranging circuit 33 may be the arranging method disclosed in Korean Patent Application Publication No. 10-2021-0006102, which is incorporated herein by reference in its entirety.

Furthermore, the third arranging method used by the third arranging logic circuit 333 included in the arranging circuit 33 may be the arranging method disclosed in Korean Patent Application Publication No. 10-2021-0021915, which is incorporated herein by reference in its entirety.

Furthermore, the arranging circuit 33 may set N number of addresses SO_ADD<1:N>, stored in the storage circuit 32, as the target address REF_ADD in an output sequence determined by one of the three arranging logic circuits 331, 332, and 333 through an arranging operation.

That is, the arranging circuit 33 may receive the N number of addresses SO_ADD<1:N>, stored in the storage circuit 32, at least one by one according to the output sequence determined by one of the three arranging logic circuits 331, 332, and 333 by performing an arranging method, and may set the received address as the target address REF_ADD.

More specifically, each of the three arranging logic circuits 331, 332, and 333 in the enable state may determine an output sequence by performing an arranging operation on the N number of addresses SO_ADD<1:N> stored in the storage circuit 32, may receive the N number of addresses SO_ADD<1:N> stored in the storage circuit 32 one by one according to the determined output sequence whenever the arranging logic circuit receives the target refresh command SR_CMD, and then, may set the received address as the target address REF_ADD.

Figure 7:
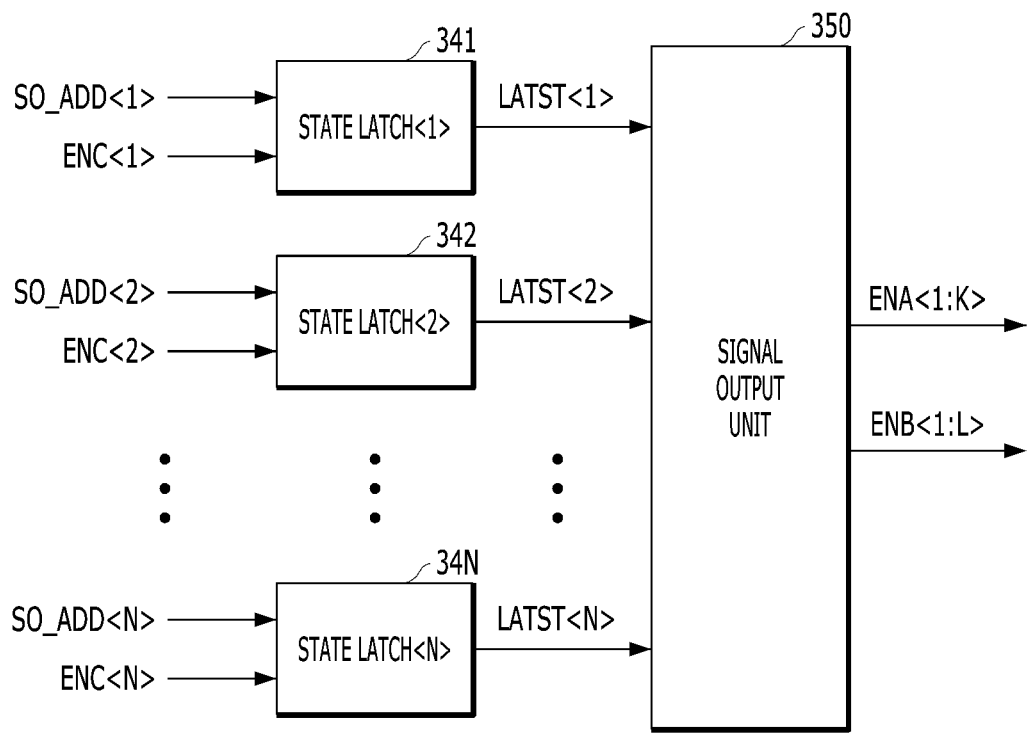
FIG. 7 is a diagram illustrating a selection control circuit among the elements of the target address management circuit illustrated in FIG. 3 according to an embodiment of the present disclosure.

FIG. 7 is a diagram illustrating the selection control circuit among the elements of the target address management circuit illustrated in FIG. 3 according to an embodiment of the present disclosure.

First, as described with reference to FIG. 3, the selection control circuit 34 may check a state of the storage circuit 32, and may determine each of values of the first selection signals ENA<1:K> and each of values of the second selection signals ENB<1:L> based on a result of the check.

Specifically, the selection control circuit 34 may include N number of state latches 341, 342, . . . , 34N and a signal output unit 350.

The N number of state latches 341, 342, . . . , 34N may correspond to the N number of address latches 321, 322, . . . , 32N included in the storage circuit 32, respectively, and states thereof may shift depending on whether the addresses SO_ADD<1:N> are stored in the N number of address latches 321, 322, . . . , 32N, respectively.

That is, the N number of state latches 341, 342, ..., 34N may change logic levels of N number of state signals LATST<1:N> latched therein, respectively, depending on whether the addresses SO_ADD<1:N> are stored in the N number of address latches 321, 322, ..., 32N, respectively.

The signal output unit 350 may check a state of each of the N number of state latches 341, 342, ..., 34N, and may selectively change and output each of values of the first selection signals ENA<1:K> and each of values of the second selection signals ENB<1:L> based on a result of the check.

More specifically, the N number of state latches 341, 342, ..., 34N included in the selection control circuit 34 may receive the N storage check signals ENC<1:N> from the storage control circuit 51 included in the storage circuit 32, respectively, in order to check states of the N number of address latches 321, 322, ..., 32N included in the storage circuit 32, and may receive the N stored addresses SO_ADD<1:N> from the N number of address latches 321, 322, ..., 32N, respectively.

Each of the N number of state latches 341, 342, ..., 34N may change a logic level of each of the N number of state signals LATST<1:N> latched therein into a first logic level, in response to each of the N storage check signals ENC<1:N> being toggled.

Furthermore, each of the N number of state latches 341, 342, ..., 34N may change a logic level of each of the N number of state signals LATST<1:N> latched therein into a second logic level in response to an address outputted as the target address REF_ADD by the arranging circuit 33 among the N number of addresses SO_ADD<1:N> respectively stored in the N number of address latches 321, 322, ..., 32N.

For example, in response to the first storage check signal ENC<1>, the second storage check signal ENC<2>, and the third storage check signal ENC<3> which are received from the storage control circuit 51 included in the storage circuit 32 and are being toggled, the first to third state latches 341, 342, and 343 of the N number of state latches 341, 342, ..., 34N may change, into the first logic level, the state signal LATST<1:3> latched therein, respectively. In such a state, when the arranging circuit 33 outputs, as the target address REF_ADD, the address SO_ADD<1> stored in the first address latch 321, the first state latch 341 may change the state signal LATST<1> latched therein into the second logic level.

For reference, the first logic level and the second logic level may mean opposite logic levels. For example, when the first logic level is a logic high level, the second logic level may be a logic low level. On the contrary, when the first logic level is a logic low level, the second logic level may be a logic high level.

As described above, each of the N number of state latches 341, 342, ..., 34N may determine, as one state of the first logic level and the second logic level, each of the N number of state signals LATST<1:N> latched therein, in response to each of the N storage check signals ENC<1:N> and an address outputted as the target address REF_ADD by the arranging circuit 33 among the N stored addresses SO_ADD<1:N>.

The signal output unit 350 may check the number of signals having the first logic level and the number of signals having the second logic level among the N number of state signals LATST<1:N> latched in the N number of state latches 341, 342, ..., 34N, respectively. Therefore, the signal output unit 350 may check how many addresses SO_ADD<1:N> are stored in the N number of address latches 321, 322, ..., 32N included in the storage circuit 32.

For example, in response to each of the first storage check signal ENC<1>, the second storage check signal ENC<2>, and the third storage check signal ENC<3> being toggled in the storage control circuit 51 included in the storage circuit 32, each of the first to third state latches 341, 342, and 343 may change a logic level of each of the state signals LATST<1:3> latched therein into the first logic level. In such a case, the signal output unit 350 may check that three addresses have been stored in the N number of address latches 321, 322, ..., 32N. In such a state, when the arranging circuit 33 outputs, as the target address REF_ADD, the address SO_ADD<1> stored in the first address latch 321, the first state latch 341 may change the state signal LATST<1> latched therein into the second logic level. In such a case, the signal output unit 350 may check that the number of addresses stored in the N number of address latches 321, 322, ..., 32N is changed from 3 to 2.

Furthermore, the signal output unit 350 may check the number of addresses stored in the N number of address latches 321, 322, ..., 32N based on the number of signals having the first logic level and the number of signals having the second logic level, among the N number of state signals LATST<1:N> respectively latched in the N number of state latches 341, 342, ..., 34N, and may selectively change each of values of the first selection signals ENA<1:K> and each of values of the second selection signals ENB<1:L> by comparing the checked number with a reference number.

In an embodiment, when the number of addresses SO_ADD<1:N> stored in the N number of address latches 321, 322, ..., 32N is the reference number or less, the signal output unit 350 may change a value of at least one signal among the values of the first selection signals ENA<1:K> and the values of the second selection signals ENB<1:L>.

For example, when the reference number is 2, the signal output unit 350 may change a value of at least one signal, among the values of the first selection signals ENA<1:K> and the values of the second selection signals ENB<1:L>, in response to the number of addresses SO_ADD<1:N> stored in the N number of address latches 321, 322, ..., 32N, which is checked as two or less.

In another embodiment, when the number of addresses SO_ADD<1:N> stored in the N number of address latches 321, 322, ..., 32N is greater than the reference number, the signal output unit 350 may maintain the values of the first selection signals ENA<1:K> and the values of the second selection signals ENB<1:L> without changing the values.

For example, when the reference number is 2, the signal output unit 350 may maintain the values of the first selection signals ENA<1:K> and the values of the second selection signals ENB<1:L> without changing the values, in response to the number of addresses SO_ADD<1:N> stored in the N number of address latches 321, 322, ..., 32N, which is checked as three or more.

In this case, when the signal output unit 350 changes the values of the first selection signals ENA<1:K>, it may mean that a sampling method used by the sampling circuit 31 is changed.

In an embodiment, when the sampling circuit 31 is operating according to a first sampling method by the first sampling logic circuit 311 enabled in response to the first selection signals ENA<1:K> being set as a first value by the signal output unit 350, when the signal output unit 350 changes the first selection signals ENA<1:K> into a second value, the second sampling logic circuit 312 may be enabled, and the sampling circuit 31 may operate according to a second sampling method designed using an algorithm different from an algorithm of the first sampling method.

Furthermore, when the signal output unit 350 changes the values of the second selection signals ENB<1:L>, it may mean that an arranging method used by the arranging circuit 33 is changed.

In an embodiment, when the arranging circuit 33 is operating according to a first arranging method by the first arranging logic circuit 331 enabled in response to the second selection signals ENB<1:L> being set as a third value by the signal output unit 350, when the signal output unit 350 changes the second selection signals ENB<1:L> into a fourth value, the second arranging logic circuit 332 may be enabled, and the arranging circuit 33 may operate according to a second arranging method designed using an algorithm different from an algorithm of the first arranging method.

The signal output unit 350 may check the number of addresses SO_ADD<1:N> stored in the N number of address latches 321, 322, . . . , 32N by checking logic levels of the N number of state signals LATST<1:N> latched in the N number of state latches 341, 342, . . . , 34N, respectively, every set period. In this case, the set period may be set based on a specific operation being performed by the memory apparatus 1000.

In an embodiment, the set period may be set based on the number of refresh operations being performed by the memory apparatus 1000.

For example, the set period may be a period repeated whenever a refresh operation is performed once on all word lines included in the memory apparatus 1000.

In another embodiment, the set period may be set based on the number of active commands inputted to the memory apparatus 1000.

For example, the set period may be a period repeated whenever the number of active commands inputted to the memory apparatus 1000 reaches a predetermined specific number.

The present disclosure described above is not limited by the aforementioned embodiments and the accompanying drawings. It is evident to a person having ordinary knowledge in the art to which the present disclosure pertains that the present disclosure may be substituted, modified, and changed in various ways without departing from the technical spirit of the present disclosure and the following claims. Furthermore, the embodiments may be combined to form additional embodiments.

What is claimed is:

1. A memory apparatus comprising:
    a sampling circuit suitable for sampling an input address through a sampling method corresponding to a value of a first selection signal among at least two sampling methods designed using different algorithms;
    a storage circuit suitable for storing up to N number of addresses having different values among sampled addresses received from the sampling circuit;
    an arranging circuit suitable for:
        determining an output sequence of addresses stored in the storage circuit through an arranging method corresponding to a value of a second selection signal among at least two arranging methods designed using different algorithms, and
        setting, as a target address, an address outputted by the storage circuit according to the output sequence;
    a selection control circuit suitable for:
        checking a state of the storage circuit, and
        setting the value of each of the first selection signal and the second selection signal based on a result of the check; and
    a refresh operation circuit suitable for controlling a target refresh operation on a row of memory cells corresponding to the target address,
    wherein N is a natural number equal to or greater than 2.

2. The memory apparatus of claim 1, wherein the sampling circuit includes at least two sampling logic circuits each suitable for outputting the sampled address by sampling the input address through a corresponding sampling method among the at least two sampling methods.

3. The memory apparatus of claim 2, wherein
    each of the sampling logic circuits is enabled according to the value of the first selection signal, and
    wherein the enabled sampling logic circuit outputs the sampled address by performing a sampling operation on the input address through the corresponding sampling method.

4. The memory apparatus of claim 1, wherein the storage circuit comprises:
    N number of address latches; and
    a storage control circuit suitable for:
        comparing a value of the sampled address with values of addresses respectively stored in the N number of address latches, and
        storing the sampled address in the respective N number of address latches based on a result of the comparison.

5. The memory apparatus of claim 4, wherein the arranging circuit includes at least two arranging logic circuits each suitable for:
    determining an output sequence through a corresponding arranging method among the at least two arranging methods, and
    setting, as the target address, an address stored in a latch corresponding to the output sequence among the N number of address latches.

6. The memory apparatus of claim 5, wherein each of the arranging logic circuits is enabled according to the value of the second selection signal, and
    wherein the enabled arranging logic circuit determines the output sequence through the corresponding arranging method and sets, as the target address, the address stored in the latch corresponding to the output sequence among the N number of address latches in response to a target refresh command.

7. The memory apparatus of claim 4, wherein the selection control circuit is suitable for:
    checking a number of latches in which addresses are stored among the N number of address latches every set period, and
    selectively changing the values of the first selection signal and the second selection signal based on a result of the check.

8. The memory apparatus of claim 7, wherein the selection control circuit changes the value of at least one signal of the first selection signal and the second selection signal when the number of latches in which addresses are stored among the N number of address latches is less than or equal to a reference number.

9. The memory apparatus of claim 8, wherein the selection control circuit maintains the value of each of the first selection signal and the second selection signal without any change when the number of latches in which addresses are stored among the N number of address latches is greater than the reference number.

10. The memory apparatus of claim 4, wherein the selection control circuit includes:
N number of state latches corresponding to the N number of address latches, respectively, and each suitable for latching a state value depending on whether an address is stored in a corresponding address latch of the N number of address latches; and
a signal output unit suitable for checking the state values of the N number of state latches and selectively changing and outputting the values of the first selection signal and the second selection signal based on a result of the check.

11. The memory apparatus of claim 1, wherein the row corresponding to the target address is disposed adjacent to a row of memory cells indicated by the target address.

12. An operating method of a memory apparatus, comprising:
a sampling operation of sampling an input address through a sampling method corresponding to a value of a first selection signal among at least two sampling methods designed using different algorithms;
a storage operation of storing up to N number of addresses having different values in N number of address latches, respectively, among addresses sampled in the sampling operation;
an arranging operation of:
determining an output sequence of the stored addresses through an arranging method corresponding to a value of a second selection signal among at least two arranging methods designed using different algorithms, and
setting, as a target address, an address stored in a latch corresponding to the output sequence among the N number of address latches;
a determination operation of determining the value of each of the first selection signal and the second selection signal based on a number of latches in which addresses are stored among the N number of address latches; and
an operation of performing a target refresh operation on a row of memory cells corresponding to the target address,
wherein N is a natural number equal to or greater than 2.

13. The operating method of claim 12, wherein the storage operation comprises:
comparing a value of the sampled address with values of addresses respectively stored in the N number of address latches; and
storing the sampled address in at least one empty address latch when an identical value is not present in the comparing operation and the at least one empty latch is present among the N number of address latches.

14. The operating method of claim 13, wherein the arranging operation includes setting, as the target address, the address stored in the latch corresponding to the output sequence among the N number of address latches in response to a target refresh command.

15. The operating method of claim 14, wherein the determination operation includes:
checking a number of latches in which addresses are stored among the N number of address latches every set period, and
selectively changing the values of the first selection signal and the second selection signal based on a result of the check.

16. The operating method of claim 15, wherein the determination operation includes changing the value of at least one signal of the first selection signal and the second selection signal when the number of latches in which addresses are stored among the N number of address latches is less than or equal to a reference number.

17. The operating method of claim 16, wherein the determination operation includes maintaining the value of each of the first selection signal and the second selection signal without any change when the number of latches in which addresses are stored among the N number of address latches is greater than the reference number.

18. The operating method of claim 12, wherein the row corresponding to the target address is disposed adjacent to a row of memory cells indicated by the target address.

19. An operating method of a memory device including rows of memory cells, the operating method comprising:
sampling input addresses according to a selected one of sampling schemes;
latching the sampled addresses such that the latched addresses are different from one another;
arranging the latched addresses according to an arranging scheme;
selecting target addresses sequentially from the arranged addresses; and
performing target refresh operations on the rows corresponding to the target addresses, respectively,
wherein the sampling includes selecting the sampling scheme based on a number of the latched addresses.

* * * * *